United States Patent
Chuan et al.

(10) Patent No.: US 7,109,740 B2
(45) Date of Patent: Sep. 19, 2006

(54) METHOD FOR RETESTING SEMICONDUCTOR DEVICE

(75) Inventors: Chin-Chen Chuan, Kaohsiung (TW);
Chiu-Cheng Lin, Kaohsiung (TW);
Cheng Chieh Lee, Kaohsiung (TW);
Kuei Lin Huang, Kaohsiung (TW);
Yong Liang Chen, Kaohsiung (TW);
Jui Liang Wang, Kaohsiung (TW);
Pao Ta Chien, Kaohsiung (TW);
Hsiang-Han Kung, Kaohsiung (TW);
Chao Hsiung Hwu, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/167,147

(22) Filed: Jun. 28, 2005

(65) Prior Publication Data
US 2006/0022697 A1 Feb. 2, 2006

(30) Foreign Application Priority Data
Jun. 28, 2004 (TW) .............................. 93118875 A

(51) Int. Cl.
*G01R 31/26* (2006.01)

(52) U.S. Cl. .................................. 324/765; 324/158.1

(58) Field of Classification Search .................... None
See application file for complete search history.

(56) References Cited

U.S. PATENT DOCUMENTS

| 6,066,822 A | * | 5/2000 | Nemoto et al. | ............. 209/573 |
| 6,518,745 B1 | * | 2/2003 | Kim et al. | ............... 324/158.1 |

* cited by examiner

*Primary Examiner*—Minh N. Tang
(74) *Attorney, Agent, or Firm*—Bacon & Thomas, PLLC

(57) ABSTRACT

A method for re-testing semiconductor device includes following processes: (1) providing a first carrier for accommodating semiconductor devices which have been tested; (2) taking the semiconductor devices out from the first carrier and placing them according to the information of a fist map by a pick-and-place machine, wherein the information of the first map has the coordinates of the positions of the film frame where the semiconductor is to be placed; (3) placing the film frame with the semiconductor devices placed thereon to a testing machine, and re-testing the semiconductor devices according to the information of the first map by the tester; (4) placing the film frame with the semiconductor devices attached thereon to a pick-and-place machine, and taking the semiconductor devices out according to the result of the retesting from the film frame, and placing the semiconductor devices on at least one carriers.

6 Claims, 2 Drawing Sheets

METHOD FOR RETESTING SEMICONDUCTOR DEVICE

BACKGROUND OF THE INVENTION

1. Field of Invention

This invention is related to a method for testing a semiconductor device. More particularly, the present invention is related to a method for retesting a semiconductor device by taking back the semiconductor device which is disposed on the carrier to perform the retesting steps.

2. Related Art

After completing the manufacture of a wafer, the wafer is needed to be entered into assembly and testing steps so that the semiconductor devices provided in the wafer is able to be separated from each other, disposed on and electrically connected the motherboard. Therein, the assembly steps include the steps of wafer dicing, die attaching, wire bonding and encapsulating. However, the semiconductor devices may be damaged, destroyed or not connected well to the motherboard. Thus, the testing steps following the assembly steps are usually required so as to verify whether the function of the semiconductor devices are performed well.

According to the requirement of products, the testing steps may be performed either before or after assembly steps. As shown in FIG. 1, a wafer 1 is placed on a film frame 222, wherein the wafer 1 has a plurality of semiconductor devices 10. The wafer 1 is entered into testing processes through a tester, wherein the testing processes include the visual inspection and signal testing. After each semiconductor device or chip 10 is finished testing, the testing result will be recorded in a wafer map. Then, the chips or semiconductor devices 10 placed on the film frame 222 will be taken out and then placed on chip carrier such as Gel Pak according to the testing result recorded in the wafer map through a pick-and-place machine. Generally speaking, the testing result may divide the semiconductor devices or chips into two or more groups in different degrees. Different groups in different degrees may be placed on different carriers. For example, the chips or semiconductor devices 10 may be divided into two groups. One is qualified for shipping-out and the other is disqualified for scraping. The pick-and-place machine, according to the testing result recorded in the wafer map, will take the good chips out and then place them on the carriers so as to ship the good chips out. However, the disqualified ones will leave on the film frame 222 to be under scraping processes.

As mentioned above, if the good chips placed on the carriers are required to be divided into two different groups in different degrees, the good chips are usually not able to be placed in the tester again so as to cause such good chips to be scraped. In addition, when the yield rate of the chips are low, it is usually required to take out the chips disposed on the film frame 222 which are originally regarded as disqualified ones but not far away from the qualified standard so as to increase the yield rate. However, the tester is not able to perform the testing processes on the chips left on the film frame 222 so that the testing processes are not usually performed well.

Therefore, providing another testing method to solve the mentioned-above disadvantages is the most important task in this invention.

SUMMARY OF THE INVENTION

In view of the above-mentioned problems, an objective of this invention is to provide a method for retesting the semiconductor device so that the semiconductor device placed on the carrier is able to be taken out and retested. Furthermore, another objective of this invention is to provide a method for retesting the semiconductor device so that the semiconductor device left on the film frame is able to be retested.

To achieve these and other advantages and in accordance with the purpose of the invention, as embodied and broadly described herein, the invention specifically provides a method for retesting a semiconductor device. Therein, the method comprises the steps of providing a first carrier for carrying a plurality of tested semiconductor devices, taking out the tested semiconductor device from the first carrier through a pick-and-place machine and placing the semiconductor device on a film frame according to a first wafer map, wherein the first wafer map at least includes a plurality of pre-arranged location coordinates of the semiconductor devices on the film frame, placing the film frame in a tester and performing retesting steps by the tester through the first wafer map, taking out the film frame with semiconductor devices thereon and then placing it in the pick-and-place machine, taking out the qualified semiconductor devices out by the pick-and-place machine according to the retesting result and placing the qualified ones in a second carrier in sequence through the retesting result.

In accordance with this invention as shown above, the tested semiconductor devices are taken out in sequence by the pick-and-place machine and are placed in a predetermined location of the film frame so that the tester is able to test the rearranged semiconductor devices in the film frame. Thus, it is easier to test the semiconductor devices and the scraping amounts will be reduced.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
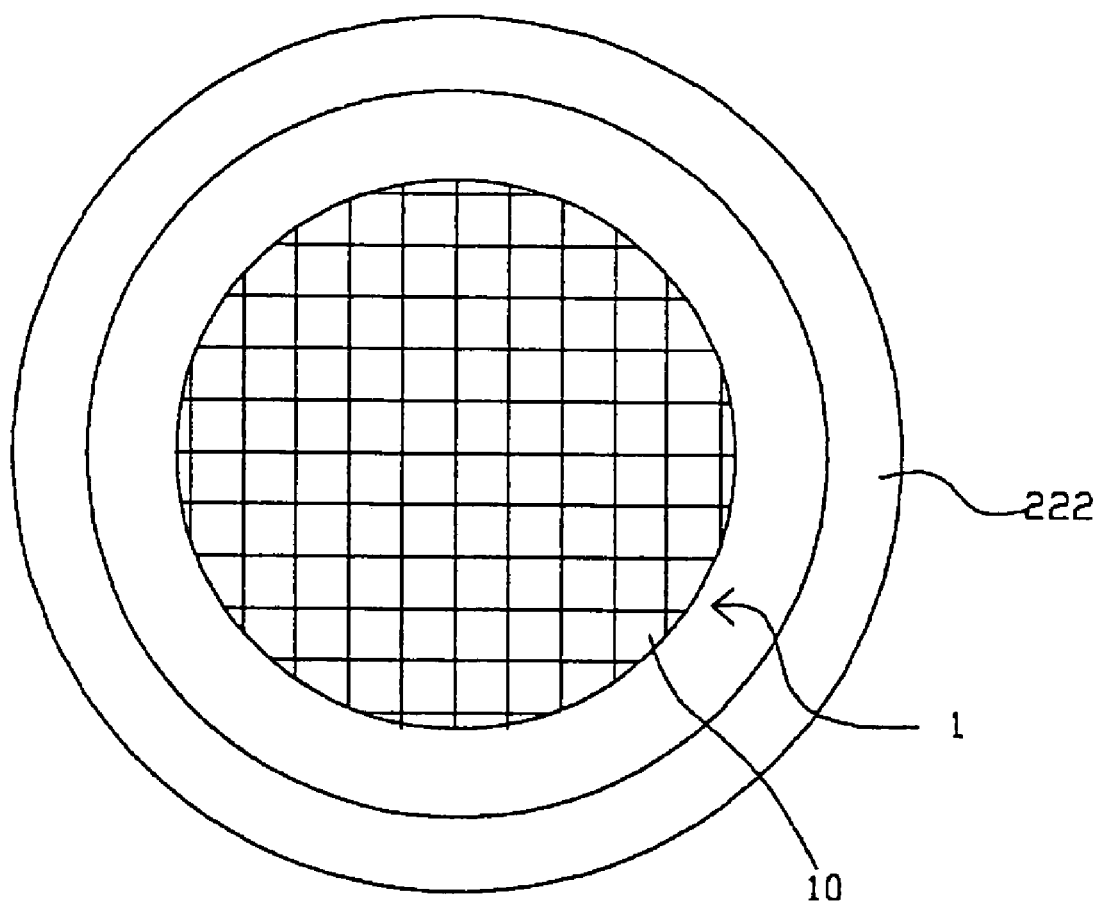
FIG. 1 is a schematic figure showing the wafer is placed on a film frame.

The method for retesting the semiconductor device thereof according to the preferred embodiment of this invention will be described herein below with reference to the accompanying drawings, wherein the same reference numbers are used in the drawings and the description to refer to the same or like parts.

Firstly, a device under test (DUT), such as a wafer, is attached to a film frame. The wafer includes a plurality of semiconductor devices which are electrically isolated from each other. Next, a tester is provided, and the wafer is under a first test through the tester and the first test result is recorded. Therein, the first test can be performed either after or before the wafer is singulated into a plurality of separated semiconductor chips.

Next, a pick-and-place machine is provided. The qualified semiconductor chips are taken out from the film frame 222 in sequence through the pick-and-place machine and then the qualified semiconductor chips are placed in a first carrier and a second carrier respectively according to the qualified degrees recorded in the test result. Therein, the carrier can be a Waffle Pak, a Gel Pak, a Tape and Reel and a turb and a tray. In the embodiment, the testing result includes three degress: degree A, degree B, and degree C. The tested semiconductor chips labeled as degree A level or degree B level are the qualified ones which are able to be shipped out. However, the tested semiconductor chips labeled as degree C are the failed ones. The failed semiconductor chips labeled as degree C are left on the film frame 222, but the qualified semiconductor chips labeled as degree A or degree B are placed in the first carrier and the second carrier according to their degrees respectively.

Next, a re-testing process is performed wherein the re-testing process may include the modification of the program for getting a revised testing result or the step of dividing the failed semiconductor into different groups in different degrees. Therein, the re-testing process is used for re-dividing the qualified semiconductor chips placed on the carrier into different groups in different degrees or used for retesting the failed semiconductor chips left on the film frame 222.

Figure 2:
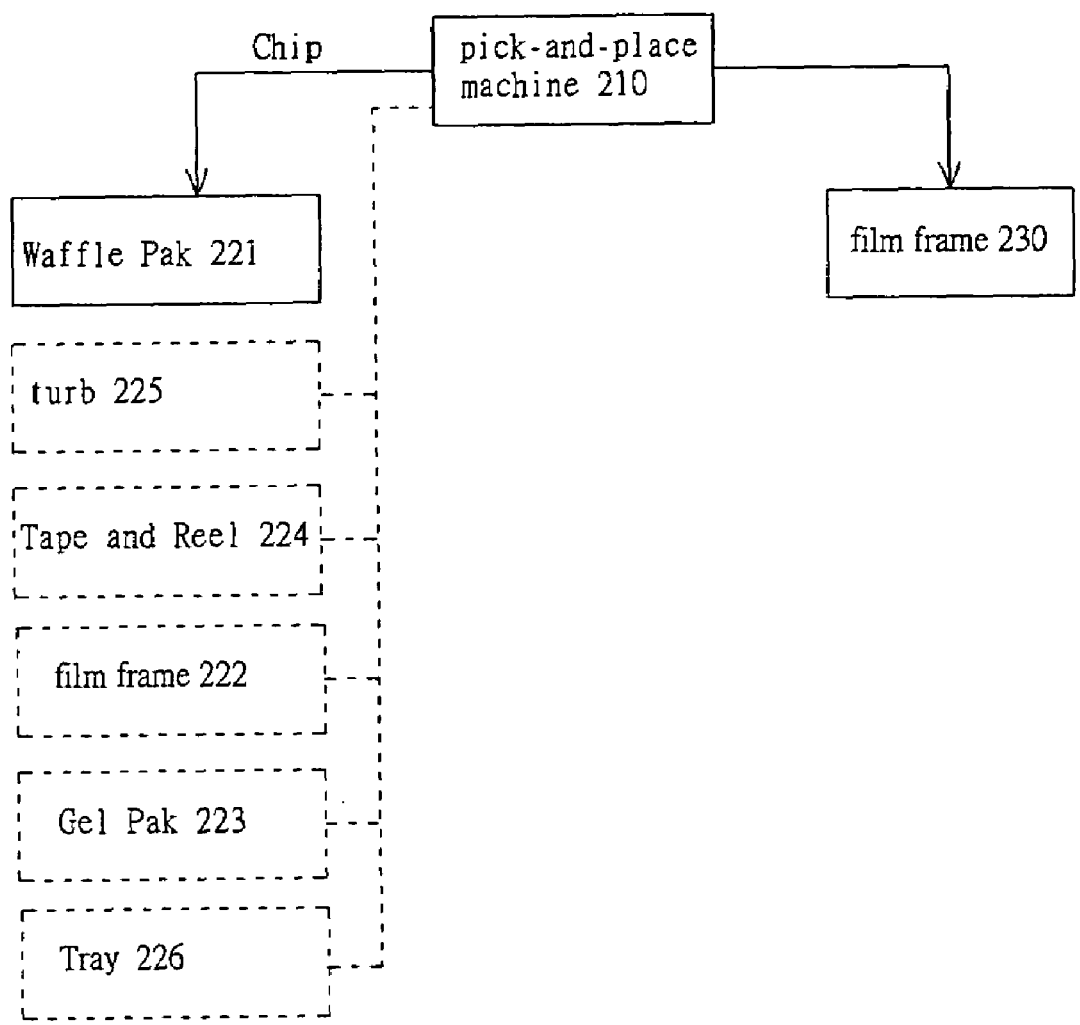
FIG. 2 is a schematic figure showing the pick-and-place machine is able to be adapted to different types of carriers, and able to take out the semiconductor devices and rearrange the semiconductor devices on the film frame.

In the present embodiment, the second testing process (re-testing process) is the step of re-dividing the qualified semiconductor chips from two degrees to three degrees. Firstly, the pick-and-place machine takes all of the qualified semiconductor chips from the first carrier and the second carrier, and than place the semiconductor chips on another new film frame. Referring to FIG. 2, the pick-and-place machine 210 is able to fit different types of carriers 220. The pick-and-place machine 210 takes the semiconductor chips from the Waffle Pak 221, and then the semiconductor chips are rearranged on a film frame 222 (ie. the second film frame 230 shown in FIG. 2). Therefore, the semiconductor chips placed in a carrier (Waffle Pak 221) are re-arranged and placed in another carrier (second film frame 230). Besides, the pick-and-place machine 210 also can take the semiconductor chips left on the film frame (ie. the first film frame 222 shown in FIG. 2) out, and re-arrange the semiconductor chips on another second film frame 230. When the pick-and-place machine takes the qualified semiconductor chips on the other second film frame 230, the semiconductor chips are placed according to the information in a first map. The first map includes the location coordinates, size, and the first testing result of the semiconductor chips. The location coordinates of the semiconductor chips can be determined by the following steps. Firstly, the maximum location area A is defined on the second film frame 230. Next the left corner of the area A is defined as a reference point O. The coordinate of the reference point is (0,0). The sizes of the qualified semiconductor chips and the minimum and maximum allowable space between the chips are given. The maximum amounts of semiconductor chips arranged within the area A is able to be determined. The coordinates of each semiconductor chip can be determined through the coordinate of the reference point O. The coordinates of each semiconductor chip and the relative information are recorded in the first map.

The semiconductor chips are placed on second film frame 230 in sequence. The second film frame 230 is placed in a tester. A re-testing step is performed by the tester through the coordinates of each semiconductor chips and the relative information recorded in the first map. Therefore, the qualified semiconductor chips could be divided from two degrees to three levels or more. The re-testing resulis recorded in a second map. The second film frame 230 are placed into the pick-and-place machine 210, the pick-and-place machine 210 takes the semiconductor chips with three different degrees out, and then place them onto different carriers 220. The carriers 220 include a Waffle Pak, a film frame, a Gel Pak, a Tape and Reel, a turb and a tray.

The pick-and-placed machine takes the re-tested semiconductor chips out, and place the semiconductor chips on a per-determined position on the film frame 222. Therefore, the testing machine can perform a re-testing step on the re-arranged semiconductor chips. Thus, it is easier to test the semiconductor devices and the scraping amounts will be reduced.

Although the device under test (DUT) is semiconductor chip, this invention is able to be applied to any kinds of semiconductor devices. The semiconductor devices at least includes WLCSPs, Ball Grid Arrays, Land Grid Arrays, and packages with lead-frame type.

Although the invention has been described in considerable detail with reference to certain preferred embodiments, it will be appreciated and understood that various changes and modifications may be made without departing from the spirit and scope of the invention as defined in the appended claims.

What is claimed is:

1. A method for re-testing a semiconductor device, the method comprising the steps of:
   providing a first carrier carrying a plurality of tested semiconductor devices;
   taking out the tested semiconductor devices from the first carrier through a pick-and-place machine;
   placing the tested semiconductor devices on a film frame according to a first wafer map, wherein the first wafer map includes the information of the tested semiconductor device and a plurality of pre-arranged location coordinates of the semiconductor devices on the film frame, and the first wafer map includes the location coordinates, size, and the first testing result of the semiconductor chip;
   placing the film frame with the semiconductor devices provided thereon in a tester and performing retesting steps by the tester through the first wafer map;
   taking out the film frame with semiconductor devices provided thereon and then placing the film frame in the pick-and-place machine; and
   taking out the semiconductor devices by the pick-and-place machine according to the retesting result and placing the semiconductor devices in a second carrier in sequence.

2. The method of claim 1, wherein the first carrier is selected from the group consisting of a film frame, a waffle, a gel pak, a set of a tape and a reel, a turb, and a tray.

3. The method of claim 1, wherein the second carrier is selected from the group consisting of a film frame, a waffle, a gel pak, a set of a tape and a reel, a turb, and a tray.

4. The method of claim 1, wherein the semiconductor devices comprise chips.

5. The method of claim 1, wherein the semiconductor devices comprise WLCSPs.

6. The method of claim 1, wherein the semiconductor devices comprise packages.

* * * * *